United States Patent
Pan et al.

(10) Patent No.: US 7,635,871 B2
(45) Date of Patent: Dec. 22, 2009

(54) LIGHT EMITTING DIODE WITH HIGHER ILLUMINATION EFFICIENCY

(75) Inventors: Shyi-Ming Pan, Taoyuan (TW); Wei-Kang Cheng, Taoyuan (TW); Kuo-Chin Huang, Taoyuan (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 0 days.

(21) Appl. No.: 12/106,277

(22) Filed: Apr. 19, 2008

(65) Prior Publication Data
US 2009/0189172 A1 Jul. 30, 2009

(30) Foreign Application Priority Data
Jan. 24, 2008 (TW) .............................. 97102637 A

(51) Int. Cl.
*H01L 27/15* (2006.01)
*H01L 31/12* (2006.01)
*H01L 33/00* (2006.01)

(52) U.S. Cl. .............................. 257/79; 257/81; 257/88; 257/98; 257/99; 257/E33.061

(58) Field of Classification Search .................. 257/79, 257/81, 88, 98, 99, E33.061
See application file for complete search history.

(56) References Cited

U.S. PATENT DOCUMENTS
6,586,874 B1 * 7/2003 Komoto et al. .............. 313/503

* cited by examiner

*Primary Examiner*—Thien F Tran
(74) *Attorney, Agent, or Firm*—Ming Chow; Sinorica, LLC

(57) ABSTRACT

A light emitting diode (LED) with higher illumination efficiency is revealed. The LED includes a LED chip and an optical layer arranged on the bottom of the LED chip. The optical layer is a light-guiding layer, a light reflective layer or an energy-conversion layer that increases light emitting efficiency of the LED. Furthermore, a rough layer is disposed between the LED chip and the optical layer so as to increase surface area of the LED chip. Thus light emitted from the LED chip enters the optical layer more easily and the illumination efficiency of the LED is increased.

6 Claims, 15 Drawing Sheets

LIGHT EMITTING DIODE WITH HIGHER ILLUMINATION EFFICIENCY

BACKGROUND OF THE INVENTION

The present invention relates to a light emitting diode, especially to a light emitting diode that increases illumination efficiency of light source.

Light emitting diode (LED) is a fine solid-state light source made of semiconductor material. The light source includes two electrodes. After being applied with voltage (minimum current), the electron-hole recombination process produces some photons due to energy gap of electrons and electron-holes when electrons cross the junction from the n- to the p-type material. The LED is different from a general light bulb and it features on low power consumption, with long lifetime, low driving voltage, and fast reaction. Moreover, the LED has compact volume, and good shock resistance so that it's suitable for mass production in the form of mini or array-type elements. It has been applied to electrical appliances, computers and communication products and has become one of the essentials in our daily lives.

According to wavelength, LED is divided into visible LED (wavelength from 450 to 680 nm) and invisible LED (wavelength from 850 to 1550 nm).

Once being classified by material of the epitaxy layer, the LED is divided into four categories: binary compound (such as $GaAs$, $GaSb$, $GaN$ etc.), ternary compound (such as $Al_xGa_{1-x}As$, $Al_xGa_{1-x}P$, $In_{1-x}Ga_xAs$ etc.), quaternary compound (such as $AlInGaP$, $InAlGaAs$, $Al_xGa_{1-x}As_yP_{1-y}$ etc.) and GaN-based compound.

If being differentiated by the brightness, there are two types-high brightness LED and the general LED. However, the light from LED is directive and each manufacturer has different standard for illumination. It's difficult to differentiate the high brightness LED and the general LED correctly. Moreover, the brightness and the illumination efficiency of the LED are related to material of the epitaxy layer. It's preferred to use material of the epitaxy layer as criterion to define and brightness. The high brightness LED is formed by quaternary compound and GaN-based compound while the general LED is made from binary compound/ternary compound except GaN-based compound.

Since 1968 a first commercial LED is developed by HP (Hewlett-Packard), functions and applications of the LED are improved dramatically along with improvement of material and manufacturing processes. According to Haitz's law, brightness of the LED is doubled per 18~24 months while the cost of each unit is reduced to about one tenth per one decade. In recent years, applications of the high brightness LED are getting broader. Besides outdoor displays and traffic signs, the high brightness LED is also used in light sources of vehicles and backlight sources of LCD on portable electric appliances. After analyzing global market of high brightness LED in 2003, the main application is in portable electric appliances, especially the camera phones. Due to population of mobile phones with colorful displays and camera phones with flashlight, demands for high cost white-light LED increase dramatically so that the mobile phones achieves about 41% market share of the high brightness LED in 2003. Compared with the amount in 2002, the market share grows 3%. As to the LED for the future, due to increasing improvement of illumination efficiency and brightness of LED, Mercury became one of the forbidden materials to be used in EU after 2006, and increasing cost of global energy, it is expected that high brightness LED is going to replace other light sources available now in the market of illumination devices, vehicles and middle/large size displays. Generally, high brightness LED is still a niche product in illumination products. Just like clothes and food, the amount of illumination devices should be satisfied firstly and then the quality is required. Without sufficient light or brightness, individual's working efficiency or vision may be affected. This also has negative effects on people's physical and mental health.

SUMMARY OF THE INVENTION

Therefore it is a primary object of the present invention to provide a light emitting diode with higher light emitting efficiency that includes an optical layer such as a light-guiding layer, a light reflective layer or an energy-conversion layer arranged on bottom of the LED chip for increasing light emitting efficiency.

It is another object of the present invention to provide a light emitting diode with higher light emitting efficiency that includes a rough layer disposed between LED chip and the optical layer so as to increase surface area of the LED chip. Thus light emitted from the LED chip enters the optical layer more easily and the light emitting efficiency of the LED is improved.

In order to achieve above objects, the present invention provides a light emitting diode that increases illumination efficiency of light source. The LED consists of a LED chip and an optical layer arranged bottom of the LED chip. The optical layer can be a light-guiding layer, a light reflective layer or an energy-conversion layer that increases illumination efficiency of the LED. Moreover, a rough layer is disposed between the LED chip and the optical layer to increase surface area of the LED chip. Thus light from the LED chip enters the optical layer more easily and illumination efficiency of the LED is further improved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
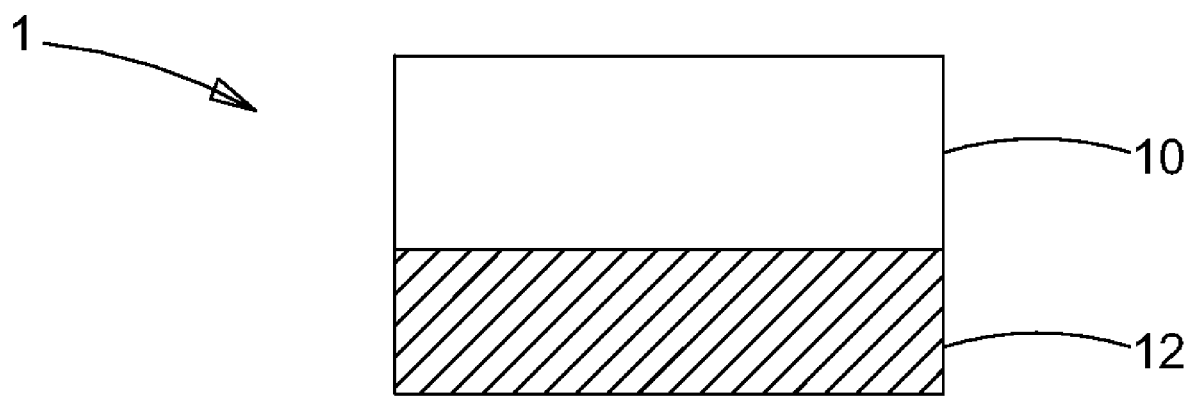
FIG. 1 is a schematic drawing showing an embodiment of a light emitting diode according to the present invention.
Figure 2:
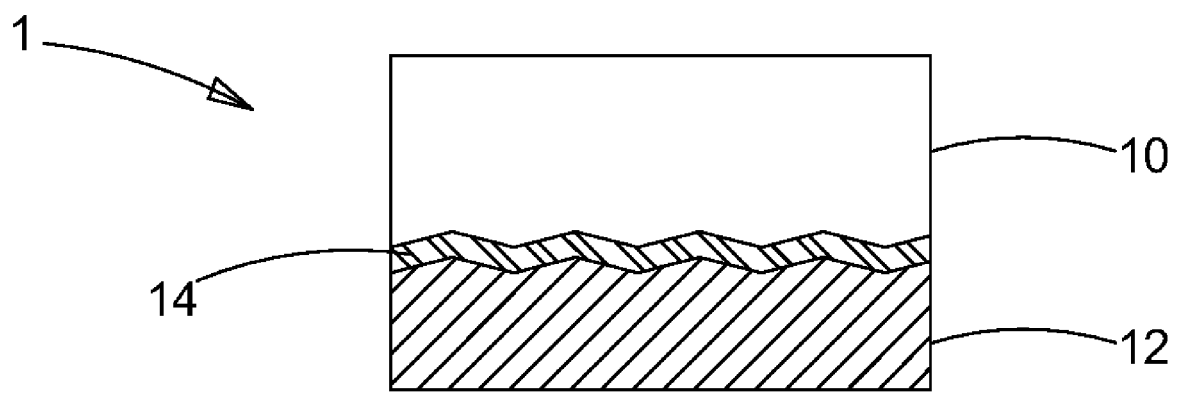
FIG. 2 is a schematic drawing showing another embodiment of a light emitting diode according to the present invention.

Refer to FIG. 1, a light emitting diode 1 with higher illumination efficiency is composed of a light emitting diode (LED) chip 10 and an optical layer 12 that is disposed on the bottom of the LED chip 10. The optical layer 12 can be a light-guiding layer, a light reflective layer or an energy-conversion layer and the minimum thickness thereof is 5 um. Refer to FIG. 2, another embodiment is revealed. The LED 1 of this embodiment further includes a rough layer 14 that is arranged between the LED chip 10 and the optical layer 12. The surface roughness of the rough layer 14 ranges from 0.5 nm to 150 nm so as to effectively increase surface area of the LED 1, improve heat dissipation effect and reduce reflection of the light from the LED chip 10. Moreover, the light from the LED chip 10 gets more easily to enter the optical layer 12 so that the light emitting efficiency is improved.

Figure 3A:
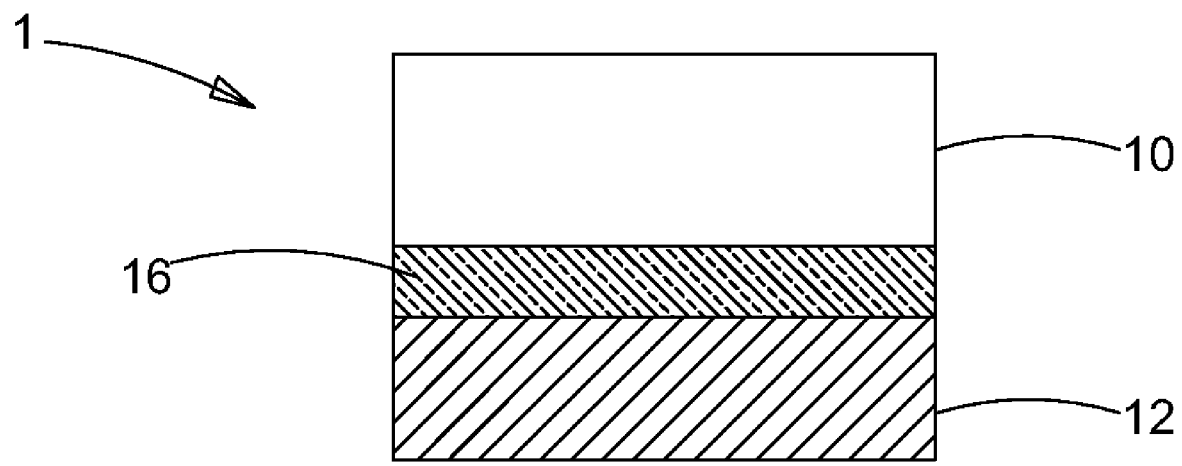
FIG. 3A is a schematic drawing showing a further embodiment of a light emitting diode according to the present invention.
Figure 3B:
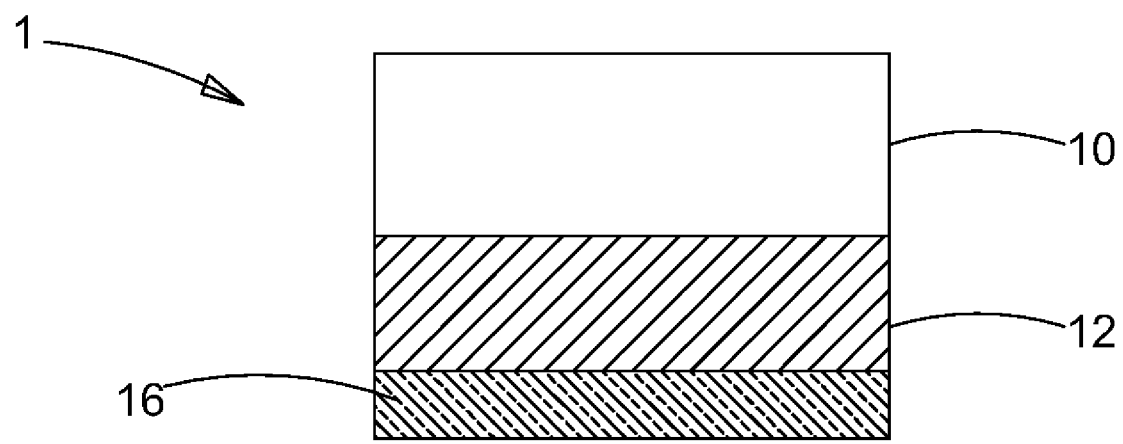
FIG. 3B is a schematic drawing showing a further embodiment of a light emitting diode according to the present invention.

Refer to FIG. 3A & FIG. 3B, a further embodiment is disclosed. A LED 1 that increases illumination efficiency according to the present invention consists of a light emitting diode (LED) chip 10 and an optical layer 12 that is disposed on the bottom of the LED chip 10. The optical layer 12 is a light-guiding layer. The LED 1 further includes an energy-conversion layer 16 that is disposed between the LED chip 10 and the optical layer 12, or is arranged on the optical layer 12, opposite to the LED chip 10. The energy-conversion layer 16 is to covert wavelength of light from the LED chip 10 while the optical layer 12 working as the light-guiding layer is used to guide the direction of the light converted by the energy-conversion layer 16 so as to improved illumination efficiency of the LED 1.

Figure 4A:
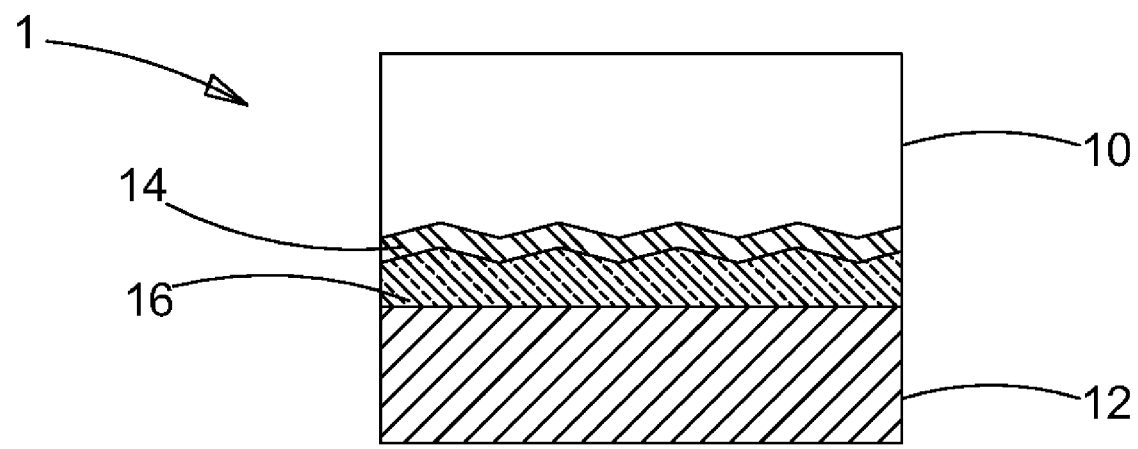
FIG. 4A is a schematic drawing showing a further embodiment of a light emitting diode according to the present invention.
Figure 4B:
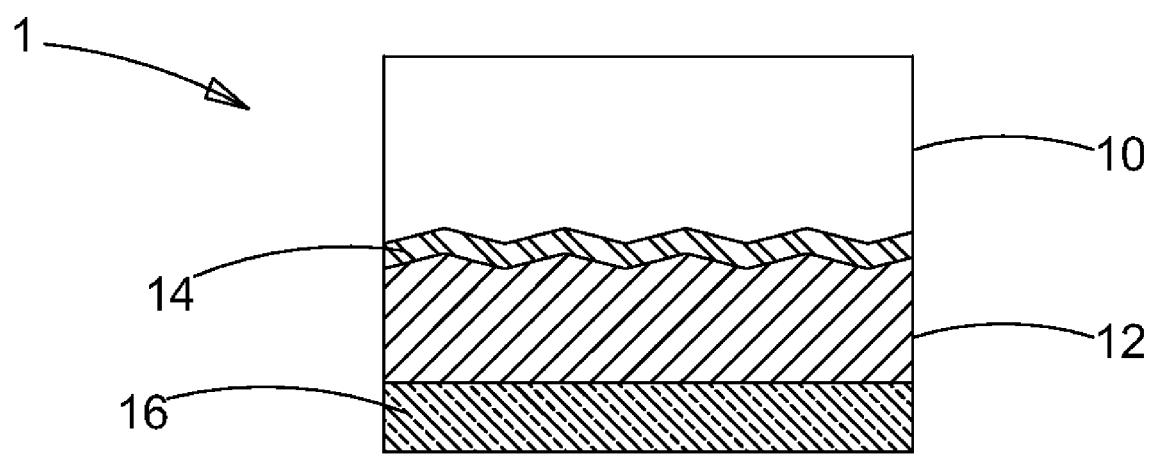
FIG. 4B is a schematic drawing showing a further embodiment of a light emitting diode according to the present invention.

Refer to FIGS. 4A & 4B, a further embodiment of a LED 1 is disclosed. The difference between this embodiment and the one shown in FIG. 3A & FIG. 3B is in that a rough layer 14 is disposed between the LED chip 10 and the energy-conversion layer 16, as shown in FIG. 4A. Or the rough layer 14 is arranged between the LED chip 10 and the optical layer 12, as shown in FIG. 4B. The surface roughness of the rough layer 14 ranges from 0.5 nm to 150 nm so that the light emitting efficiency of the LED 1 is further improved.

Figure 5:
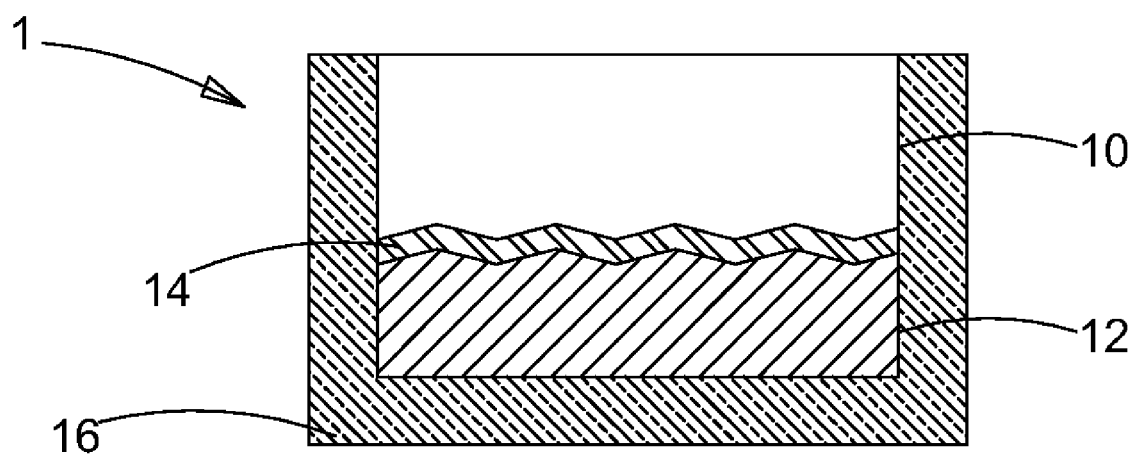
FIG. 5 is a schematic drawing showing a further embodiment of a light emitting diode according to the present invention.

Refer to FIG. 5, a further embodiment of a LED 1 according to the present invention is revealed. This embodiment is improved from the embodiment in FIG. 4B and the energy-conversion layer 16 extends and covers two sides (edges) of the LED chip 10. The direction of the light from the LED chip 10 is guided by the optical layer 12 that is used as light-guiding layer while the energy-conversion layer 16 that covers the sides of the LED chip 10 so that the light conversion efficiency of the LED 1 is increased.

Figure 6:
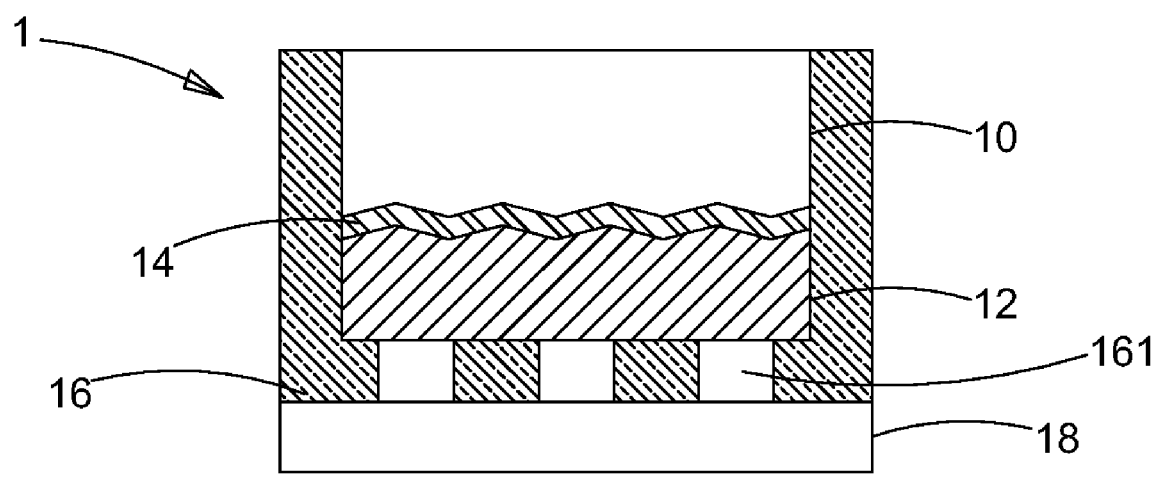
FIG. 6 is a schematic drawing showing a further embodiment of a light emitting diode according to the present invention.

Refer to FIG. 6, the difference between this embodiment and the one in FIG. 5 is in that the energy-conversion layer 16 is disposed with a plurality of heat dissipation channels 161 that is arranged with heat dissipation material (not shown in the figure) therein. Or a heat dissipation layer 18 is disposed on the bottom of the energy-conversion layer 16 so that the heat generated by the LED chip 10 are transferred to the heat dissipation layer 18 through the plurality of heat dissipation channels 161 for being dissipated. Thus heat dissipation efficiency of the LED 1 is increased.

Figure 7:
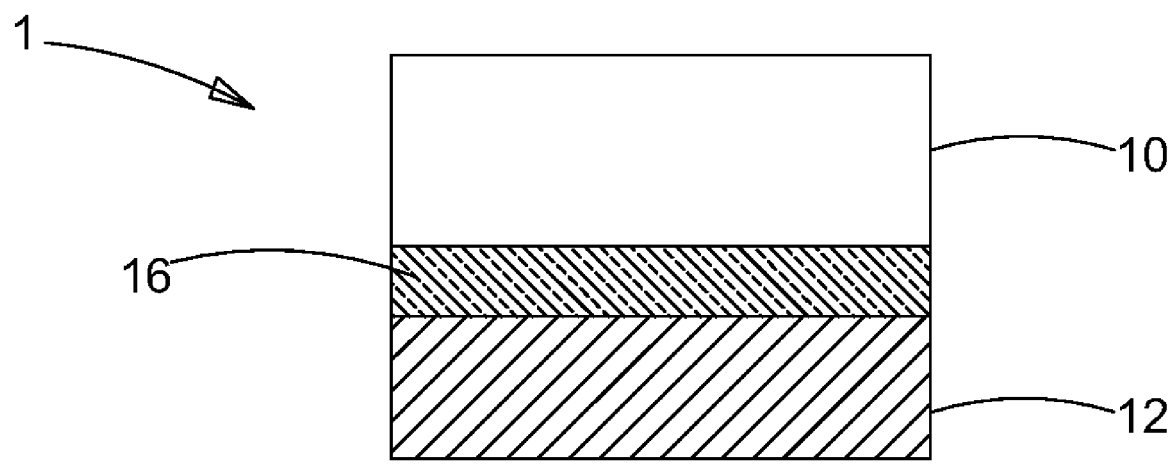
FIG. 7 is a schematic drawing showing a further embodiment of a light emitting diode according to the present invention.

Refer to FIG. 7, a LED 1 with higher illumination efficiency according to the present invention consists of a LED chip 10, an optical layer 12, and an energy-conversion layer 16. The optical layer 12 that is a reflective layer is arranged on the bottom of the LED chip 10 while the energy-conversion layer 16 is disposed between the optical layer 12 and the LED chip 10. The energy-conversion layer 16 converts light energy from the LED chip 10 while the optical layer 12 working as a reflective layer reflects the light converted by the energy-conversion layer 16 so as to increase light emitting efficiency of the LED 1.

Figure 8:
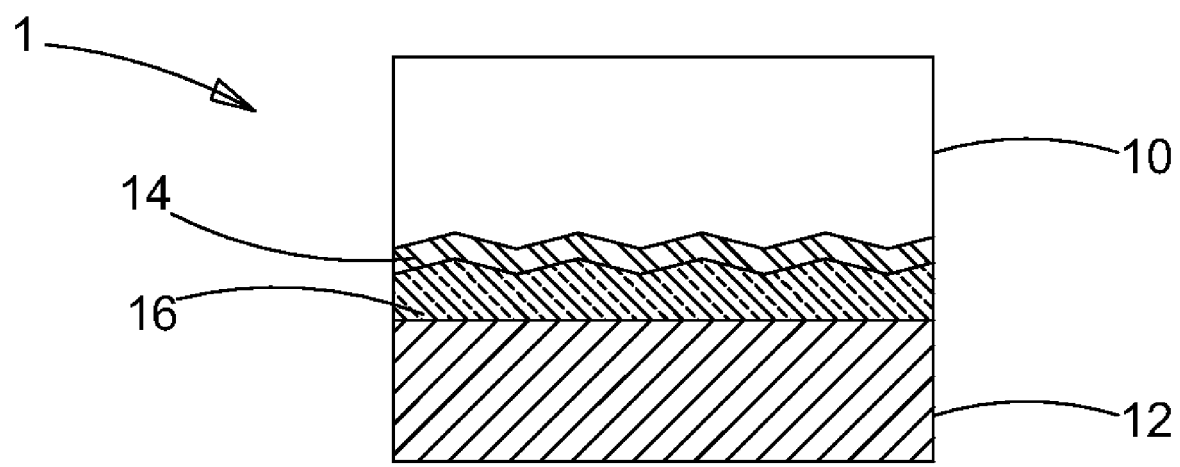
FIG. 8 is a schematic drawing showing a further embodiment of a light emitting diode according to the present invention.
Figure 9:
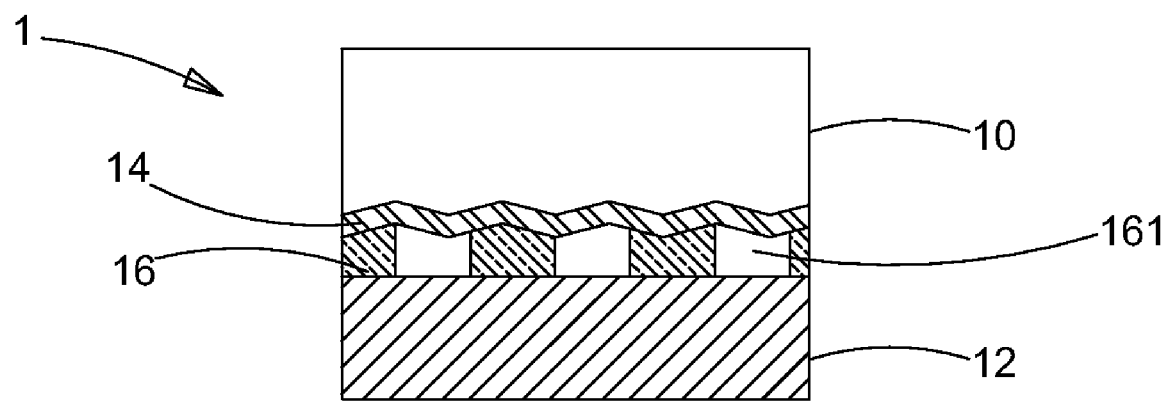
FIG. 9 is a schematic drawing showing a further embodiment of a light emitting diode according to the present invention.

Refer to FIG. 8, the difference between this embodiment and the one in FIG. 7 is in that a rough layer 14 is disposed between the LED chip 10 and the energy-conversion layer 16 and the surface roughness of the rough layer 14 ranges from 0.5 nm to 150 nm. The rough layer 14 effectively increases surface area of the LED chip 10 so that light from the LED chip 10 can enter the energy-conversion layer 16 more easily for improving the light conversion efficiency of the LED 1. Then through the optical layer 12, the light converted by the energy-conversion layer 16 is reflected so that the light emitting efficiency is further enhanced. Refer to FIG. 9, the difference between this embodiment and the one in FIG. 8 is in that the optical layer 12 is a reflective layer made from high-reflective thermal conductive material and the energy-conversion layer 16 is disposed with a plurality of heat dissipation channels 161 so that heat generated from the LED chip 10 are conducted through the heat dissipation channels 161 to the reflective layer for being released. The energy-conversion layer 16 converts light from the LED chip 10 while the reflective layer reflects the converted light. Therefore, the LED 1 has better high dissipation effect and high illumination efficiency.

Figure 10:
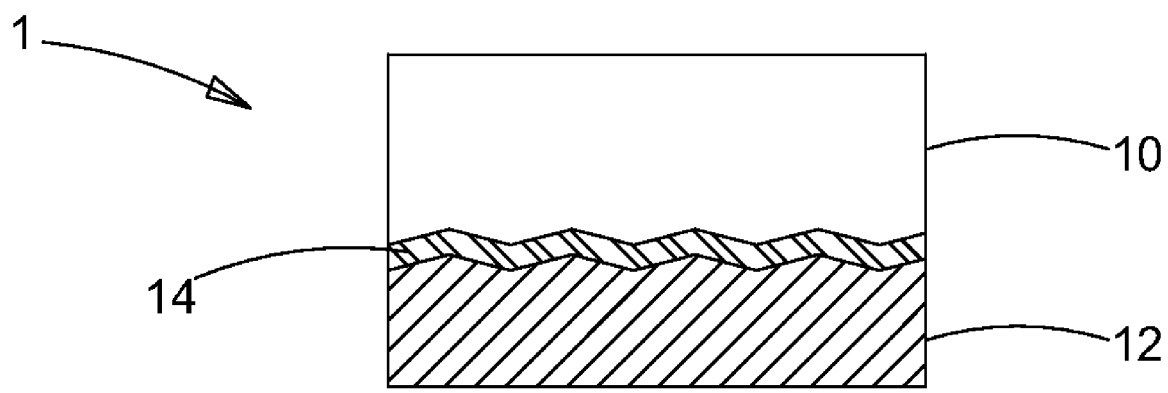
FIG. 10 is a schematic drawing showing a further embodiment of a light emitting diode according to the present invention.

Refer to FIG. 10, a LED 1 that increases illumination efficiency according to the present invention is composed of a LED chip 10, a rough layer 14 and an optical layer 12. The optical layer 12 which is an energy-conversion layer is disposed on the bottom of the LED chip 10. The optical layer 12 is made by spin coating, inkjet coating, electron-beam evaporation, sputtering, or screening printing. The rough layer 14 is arranged between the optical layer 12 and the LED chip 10 and the surface roughness of the rough layer 14 ranges from 0.5 nm to 150 nm. The rough layer 14 is to increase surface area of the LED chip 10 and make light from the LED chip 10 enter the optical layer 12 for performing light conversion more easily. Thus the light conversion efficiency and illumination efficiency f the LED 1 are improved. The optical layer 12 can further extends to cover the LED chip 10 so as to increase light conversion efficiency of the LED 1.

Figure 11:
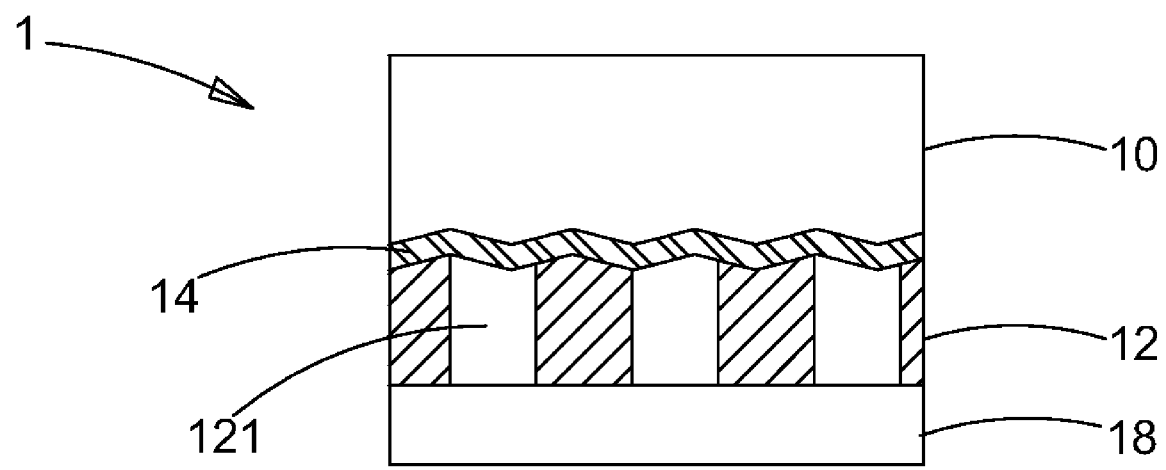
FIG. 11 is a schematic drawing showing a further embodiment of a light emitting diode according to the present invention.

Refer to FIG. 11, the difference between this embodiment and the one in FIG. 10 is in that the optical layer 12 is disposed with a plurality of heat dissipation channels 121 for dissipating heat generated by the LED chip 10. These heat dissipation channels 121 respectively is arranged with thermal conductive material (not shown in figure) or the optical layer 12 is disposed with a heat dissipation layer 18. The heat dissipation layer 18 is opposite to the LED chip 10. Heat generated from the LED chip 10 passes through these heat dissipation channels 121 and arrives the heat dissipation layer 18 to be discharged. Thus heat dissipation efficiency of the LED 1 is increased.

Figure 12:
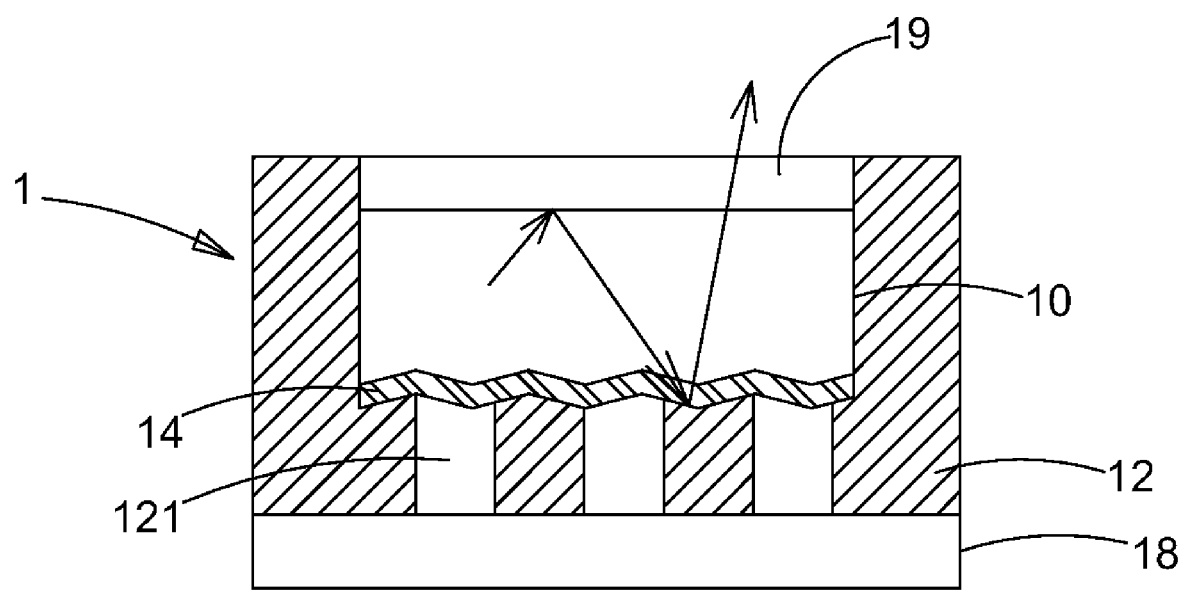
FIG. 12 is a schematic drawing showing a further embodiment of a light emitting diode according to the present invention.

Refer to FIG. 12, the difference between this embodiment and the one in FIG. 11 is in that the optical layer 12 extends and covers the LED chip 10. Moreover, a selective reflective layer 19 is disposed on the LED chip 10 and the reflective layer 19 is a Bragg grating that only light with certain wavelength can pass it while others are reflected. Thus light from the LED chip 10 passes through the selective reflective layer 19, being reflected to the optical layer 12 for light conversion. Then the converted light turns to the selective reflective layer 19 to be emitted. By increasing light conversion efficiency of the LED 1, the illumination efficiency of the LED 1 is improved. The selective reflective layer 19 can also be applied to the LED 1 with energy-conversion layer mentioned above.

Figure 13:
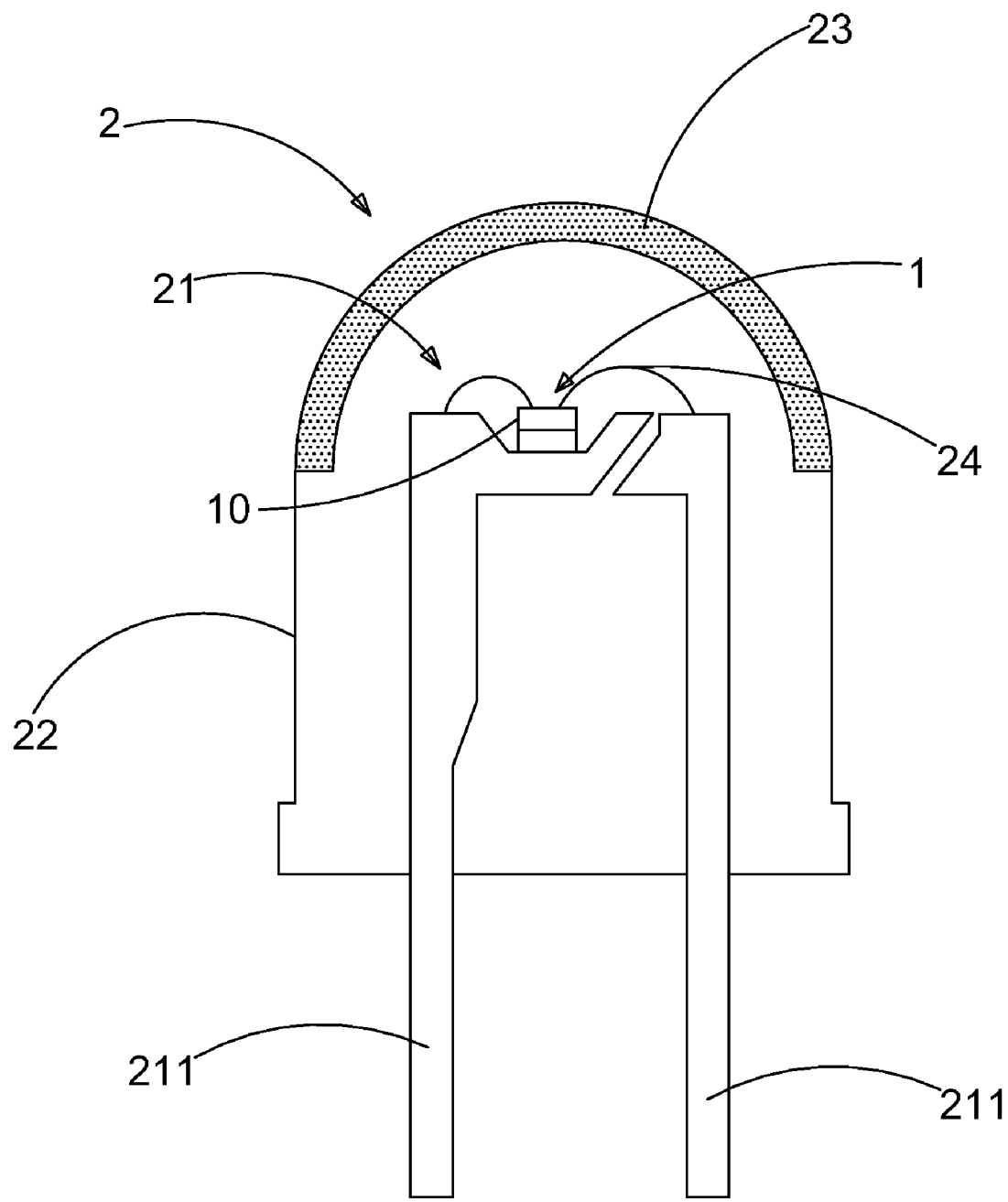
FIG. 13 is a schematic drawing showing packaging structure of an embodiment of a light emitting diode according to the present invention.

Refer to FIG. 13, the LED 1 in FIG. 1 is further disposed in a packaging member 2. The packaging member 2 consists of a loading base 21 and a covering 22. The loading base 21 is for mounting the LED 1 and is having two conductive pins 211 while the covering 22 is covered over the loading base 21. The LED chip 10 is electrically connected with the two conductive pins 211 of the loading base 21 by wires 24. Furthermore, an energy-conversion layer 23 is arranged inside the covering 22 for converting light wavelength from the LED 1. The LED 1 can be one of the above embodiments.

In summary, it is learned that a light emitting diode (LED) with higher illumination efficiency according to the present invention includes an optical layer arranged on the bottom of a LED chip. The optical layer is a light-guiding layer, a light reflective layer or an energy-conversion layer that increases light emitting efficiency of the LED. Furthermore, a rough layer is disposed between the LED chip and the optical layer so as to increase surface area of the LED chip. Thus light emitted from the LED chip enters the optical layer more easily and the illumination efficiency of the LED is increased. Moreover, an energy-conversion layer is arranged on the LED for converting wavelength of light. In addition, a plurality of heat dissipation channels is arranged on the energy-conversion layer or the optical layer for releasing heat. A thermal conductive material is arranged on each of the heat dissipation channels for improving heat releasing efficiency. Or a heat dissipation layer is arranged on bottom of the optical layer/energy conversion layer for increasing heat dissipation efficiency. A selective reflective layer is arranged on top of the LED chip so as to select light with certain wavelength being passed or reflected for increasing light conversion efficiency of the LED. Therefore, LED of the present invention do have higher light illumination efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light emitting diode (LED) with higher illumination efficiency comprising:
    a light emitting diode (LED) chip;
    an optical layer disposed on bottom of the LED chip for increasing illumination efficiency of the LED chip while the optical layer is an energy-conversion layer that extends to cover sides of the LED chip; and
    a rough layer disposed between the LED chip and the optical layer while surface roughness of the rough layer ranges from 0.5 nm to 150 nm.

2. The LED as claimed in claim 1, wherein the energy-conversion layer is formed by spin coating, inkjet coating, electron-beam evaporation, sputtering, or screening printing.

3. The LED as claimed in claim 1, wherein the LED is disposed in a packaging member that comprising:
    a loading base for mounting the LED and having two conductive pins while the LED chip is electrically connected with the two conductive pins by wires; and
    a covering covered over the loading base.

4. The LED as claimed in claim 1, wherein minimum thickness of the optical layer is 5 um.

5. The LED as claimed in claim 1, wherein the optical layer is disposed with a plurality of heat dissipation channels that are filled with a thermal conductive material.

6. The LED as claimed in claim 1, wherein the LED further comprising:
    a selective reflective layer disposed on the LED chip, corresponding to the optical layer and the selective reflective layer is a Bragg grating.

* * * * *